United States Patent
An et al.

(10) Patent No.: US 12,262,500 B1
(45) Date of Patent: Mar. 25, 2025

(54) CHASSIS INTERLOCK LATCH WITH AUTO-LOCK MECHANISM

(71) Applicant: ZT Group Int'l, Inc., Secaucus, NJ (US)

(72) Inventors: Chen An, Secaucus, NJ (US); Mahesh Kumar Varrey, Secaucus, NJ (US); Zichun Song, Secaucus, NJ (US); Robert Hastings, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 721 days.

(21) Appl. No.: 17/562,580

(22) Filed: Dec. 27, 2021

(51) Int. Cl.
   *H05K 7/14* (2006.01)

(52) U.S. Cl.
   CPC ................... *H05K 7/1489* (2013.01)

(58) Field of Classification Search
   CPC ...... H05K 7/1489; H05K 7/14; H05K 5/0221; G06F 1/1632; G06F 1/187
   See application file for complete search history.

(56) References Cited

U.S. PATENT DOCUMENTS

2016/0150659 A1* 5/2016 Chen .................. E05B 65/46
                                                        292/126

* cited by examiner

*Primary Examiner* — James Wu
*Assistant Examiner* — Dakota M Talbert
(74) *Attorney, Agent, or Firm* — Dergosits & Noah LLP; Todd A. Noah

(57) ABSTRACT

A latch assembly provides options for the retention within a rack of a chassis, and the retention within the chassis of a device. With the device in a device slot of the chassis, and the chassis installed in the rack, a first latch in a completely extended position prevents the device from being removed from the slot and prevents a latch tooth from being disengaged from the rack. With the first latch in an intermediate position, the latch tooth may be disengaged from the rack and the chassis removed from the rack, but the device may not be fully removed from the device slot. With the first latch in a retracted position the chassis may be removed from the rack and/or the device may be removed from the device slot.

15 Claims, 14 Drawing Sheets

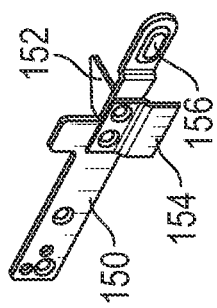
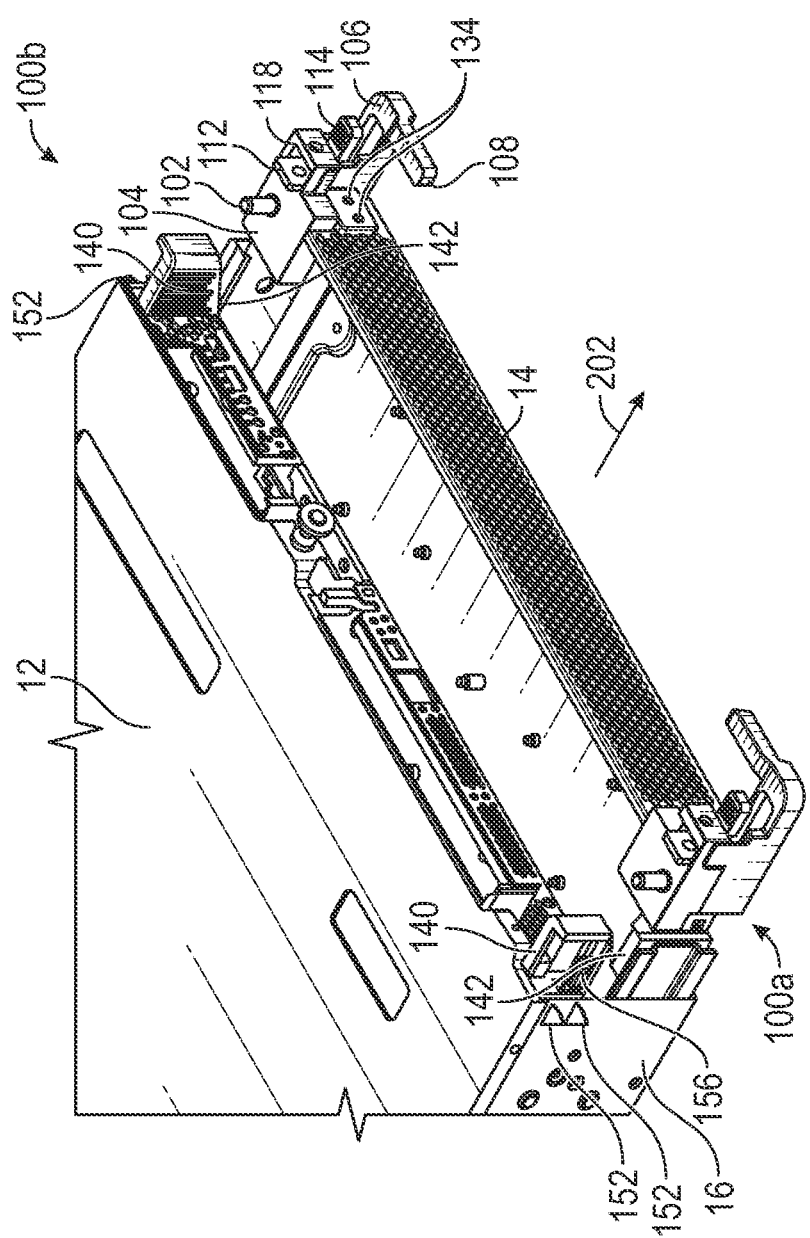
FIG. 4B
FIG. 4A

CHASSIS INTERLOCK LATCH WITH AUTO-LOCK MECHANISM

BACKGROUND

In racked server systems, a 2U chassis may have a fixed upper 1U shelf and a nested lower 1U chassis that slides on rails in the bottom 1U. The fixed upper shelf may carry a power supply unit (PSU) connected to a power management distribution unit (PMDU). Accidentally unlocking the 2U chassis would disconnect the power to the PMDU, which would create unnecessary downtime.

Thus, what is needed is a mechanism to prevent the accidental unlocking of the 2U chassis when servicing the nested lower 1U chassis.

BRIEF DESCRIPTION OF THE DRAWINGS

The embodiments are illustrated by way of example and not limitation in the accompanying drawings, in which like references indicate similar elements, and in which:

FIG. 4A is an isometric front left view of an embodiment of a chassis interlock latch and a use case;

FIG. 4B is an embodiment of a leaf spring that locks a chassis within a rack;

DETAILED DESCRIPTION

Embodiments described within disclose a chassis interlock latch mechanism that prevents the accidental unlocking of a 2U chassis unless the nested lower 1U chassis is partially unlocked first. The extra required step of unlocking the 1U chassis before the 2U chassis may be unlocked reduces the chance that a user may unlock the 2U chassis when intending to service just the nested lower 1U chassis.

Figure 1:
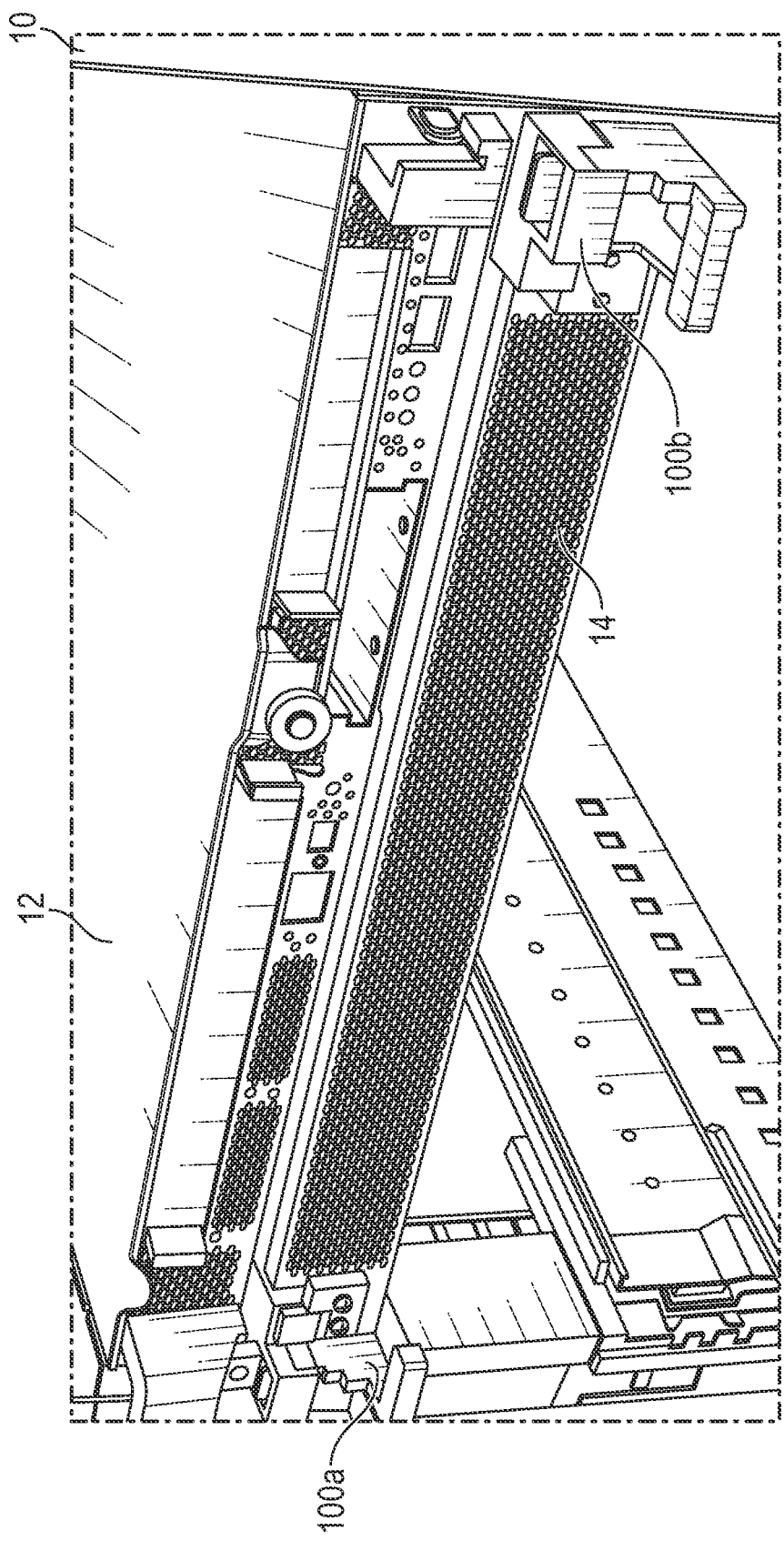
FIG. 1 is an isometric front right view of an embodiment of a chassis interlock latch and a use case.

FIG. 1 is an isometric front right view of an embodiment of a chassis interlock latch and a use case. In FIG. 1, a nested lower 1U chassis 14 includes chassis interlock latches 100*a*, 100*b*. 1U chassis 14 slides into a slot within a 2U chassis 12 within a rack 10. 1U chassis is shown partially extracted from 2U chassis 12. From this position, 1U chassis 14 may be pushed completely in, locking both 1U chassis 14 and U2 chassis 12 within rack 10 upon release of latches 100*a*, 100*b*. From this position, 1U chassis 14 may also be extracted completely from 2U chassis 12, leaving 2U chassis 12 racked and electrically connected to a PMDU (not shown).

In the embodiments, latches 100*a*, 100*b* are mirror-images of each other and the following descriptions of latch 100*a* or latch 100*b* apply equally to each other.

Figure 2:
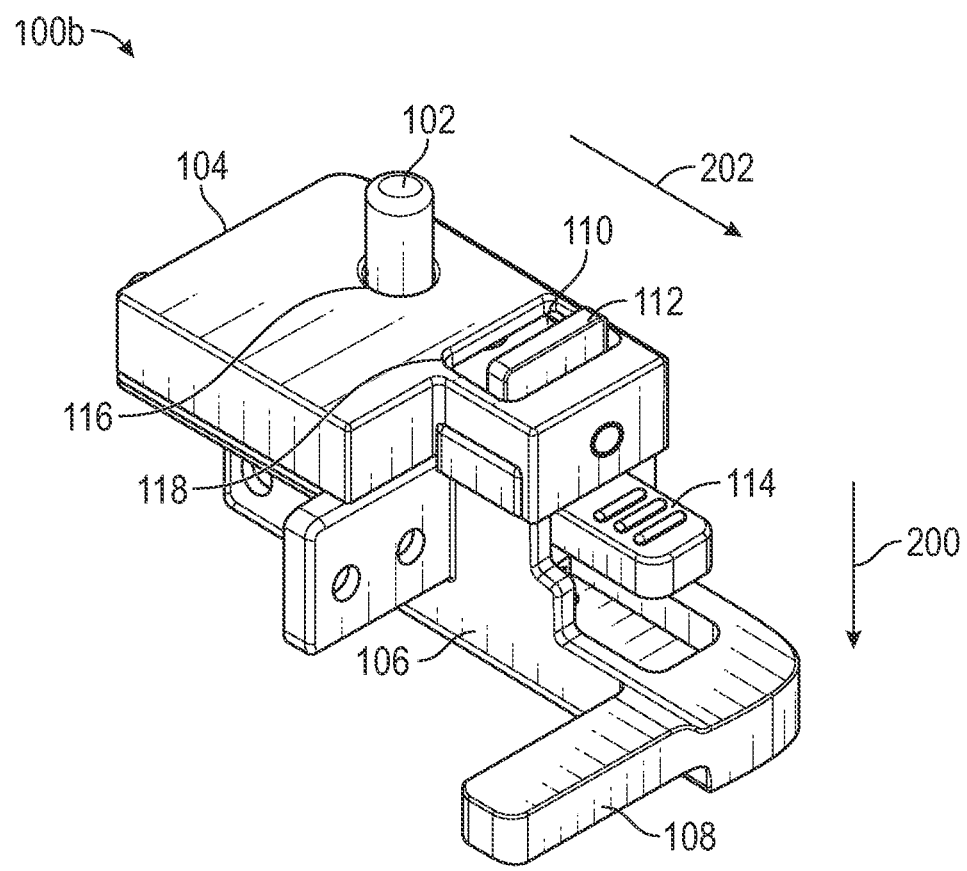
FIG. 2 is an isometric front left view of a chassis interlock latch.
Figure 3:
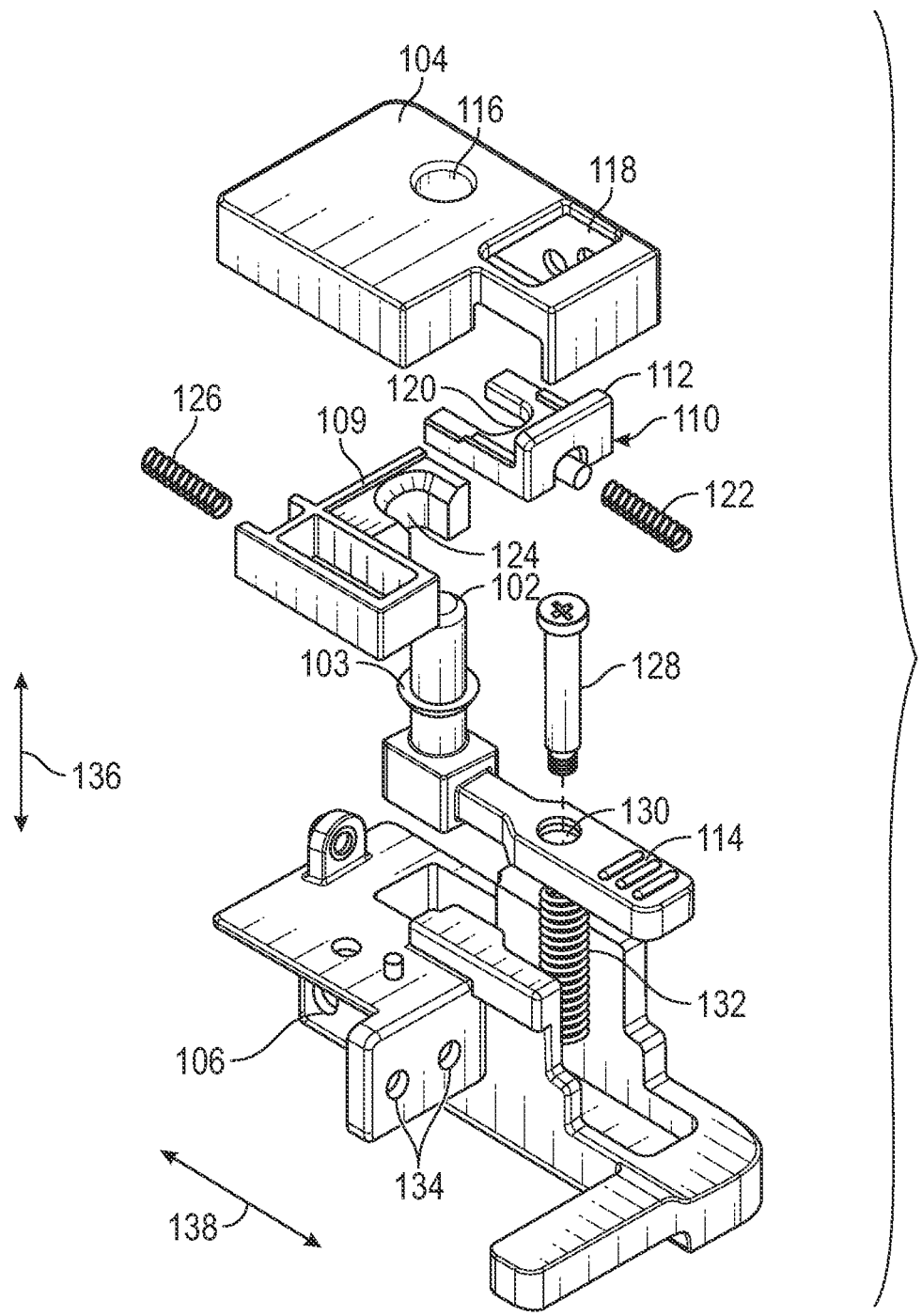
FIG. 3 is an assembly diagram of an embodiment of a chassis interlock latch.

FIG. 2 is an isometric front left view of an embodiment of a chassis interlock latch. Latch 100*b* includes a spring-loaded pin 102, which is the load-bearing component of latch 100*b* during impact. Latch 100*b* further includes a cover 104 joined to a housing 106 provided with a handle 108. Pin 102 extends from cover 104 through a hole 116. Pin 102 may be retracted into cover 104 by completely depressing a connected lever 114. The retraction of pin 102 completely within cover 104 allows 1U chassis 14 to be completely removed from 2U chassis 12. A slider 110 is housed within cover 104 and is moveable using a trigger 112 toward or away from pin 102. Trigger 112 movement is constrained by a window 118. Lever 114 may be partially depressed allowing slider 112 to be urged toward pin 102 by an associated spring 122 (FIG. 3). When engaging pin 102, with slot 120 slider 112 holds the pin in a partially extended position.

FIG. 3 is an assembly diagram of an embodiment of a chassis interlock latch. In FIG. 3, latch 100*b* is shown to further include a spring 122, biasing slider 110 with a slot 120 toward pin 102. On the other side of pin 102, a slider 109 with a slot 124 is biased by a spring 126 toward pin 102. Slots 120, 124 are moveable in directions 138 and are dimensioned to admit the cylindrical part of pin 102, but not allow a shoulder 103 to pass up through slots 120, 124 in a direction 136. Slider 109 has a thickness such that with slider 109 between shoulder 103 and hole 116, pin 102 is partially extended from hole 116 (FIG. 9*b*). From such a position, handle 114 must be further pressed down 200 to fully retracted pin 102 and allow 1U chassis 14 to be slid from 2U chassis 12. A bolt 128 through a hole 130 in handle 114 constrains the movement of pin 102 to directions 136 in conjunction with housing 106. A spring 132 biased pin 102 toward the extended position shown in FIG. 2. Latch 100*b* may be attached to 1U chassis 14 using mounting holes 134.

Sliders 109, 110 may be constructed of sheet metal, diecast metal, or other suitable material. Slider 109 retains pin 102 at a partially-retracted position that unlocks (FIG. 9B). In the embodiment, spring 112 is stronger than spring 126 such that slider 110 is more forcefully biased toward pin 102 than slider 109. Thus, slider 110 forces slider 109 backwards unless slider 110 is retracted by trigger 112.

In the embodiment of FIG. 3, shoulder 103 is shown to be continuous about pin 102. However, one of skill will realized that shoulder 103 may be discontinuous about pin 102 and still serve function as described above.

FIG. 4A is an isometric front left view of an embodiment of a chassis interlock latch and a use case. In FIG. 4A, latches 100a, 100b are incorporated into 1U chassis 14, which is partially installed in 2U chassis 12. 1U chassis 14 slides along rails within 2U chassis 12. A rail is shown partially extended from a side 16 of 2U chassis 12. In the use case, 2U chassis 12 includes a handle 140 for use in removing chassis 12 from rack 10. Protruding from side 16, as shown in FIG. 4B, teeth 152 of a leaf spring 150 lock chassis 12 within rack 10 when extended as shown. Leaf spring 150 includes a plate 154 that pin 102 interacts with to prevent leaf spring 150 from being deformed and retracting teeth 152 within side 16, as will be described further within. Leaf spring 1500 may be deformed to retract teeth 152 by a user pressing a tab 156 in the appropriate direction.

Handle 150 is further shown to include a lip 142. To insert 1U chassis 14 into 2U chassis 12 handle 114 is fully depressed to retract pin 102 into cover 104. Upon insertion, lip 142 eventually engages trigger 112. With further insertion of 1U chassis 14, lip 142 prevents trigger 112 from travelling with the rested of latch 100b, and trigger 112 is forced back within window 118.

Figure 5:
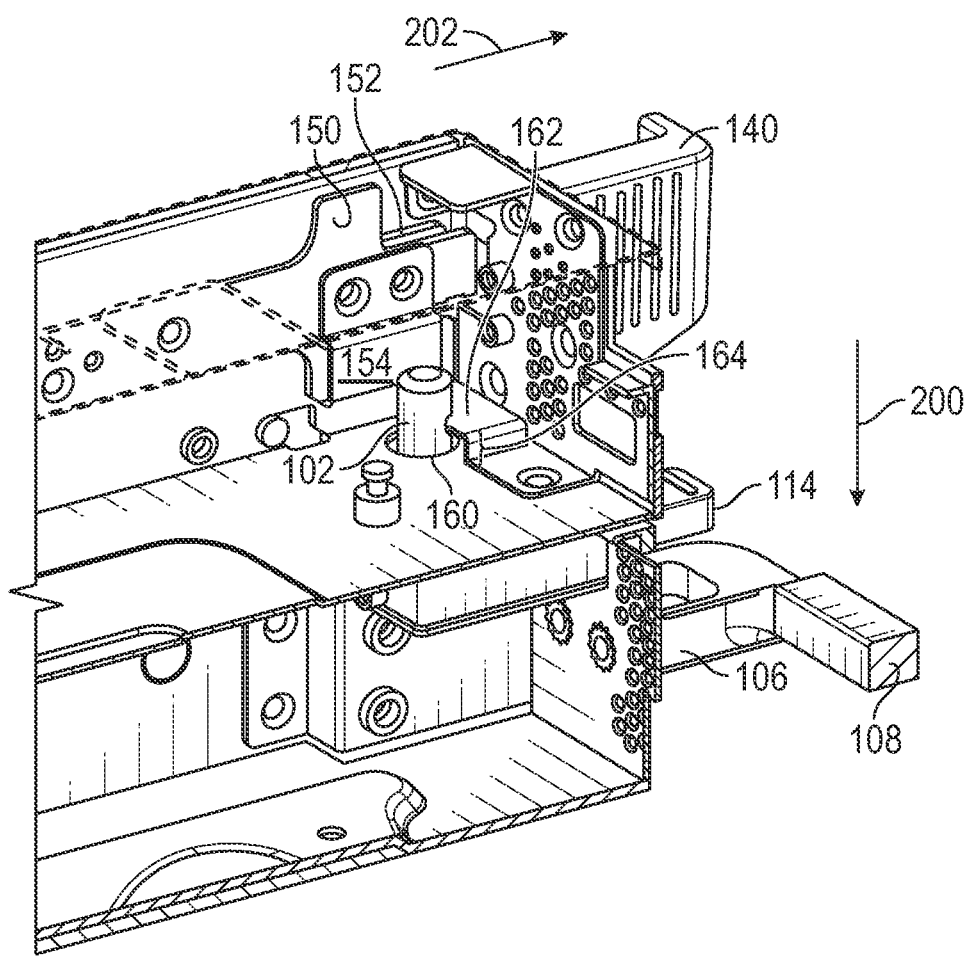
FIG. 5 is an isometric rear left cross-sectional view of an embodiment of a chassis interlock latch and a use case.

FIG. 5 is an isometric rear left cross-sectional view of an embodiment of a chassis interlock latch and a use case. In FIG. 5, pin 102 is shown extended up through a pin slot 160 in the bottom of 2U chassis 12. In this extended position, pin 102 abuts or is close to plate 154, which prevents plate 154 from moving laterally inward and retains leaf spring 150 such that teeth 152 extent from side 16 of 2U chassis 12. A striker 162, extending a distance 164 from the floor of 2U chassis 12 prevents extended pin 102 from moving forward 202 within slot 160. However, when handle 114 is depressed and pin 102 lowered until it is below distance 164, then pin 102 may travel forward 202 within slot 160 with movement of 1U chassis 14. With pin 102 just below striker 162, pin 102 may move forward 202 within slot 160 until pin 102 abuts the front face of 2U chassis 12. With pin 102 below striker 162 and still within slot 160, plate 154 may move laterally, which allows leaf spring 150 to deform and withdraw teeth 152 into 2U chassis 12.

Thus, to remove 2U chassis 12, on both latches 100a, 100b, a user must first depress handle 114 down until pin 102 is below striker 162. Then the user must press tab 156 inward to retract teeth 152. 2U chassis 12 may then be removed from rack 10. This two-step process reduces the chance that 2U chassis 12 is accidentally disconnected from rack 10.

FIG. 5 illustrates two functions of pin 102. First, leaf spring 150, which is used to secure 2U chassis 12 within rack 10, is retained in the latched position when pin 102 is extended as shown. Second, in the extended position, pin 102 abuts striker 162, preventing 1U chassis 14 from being removed from 2U chassis 12.

Figure 6A:
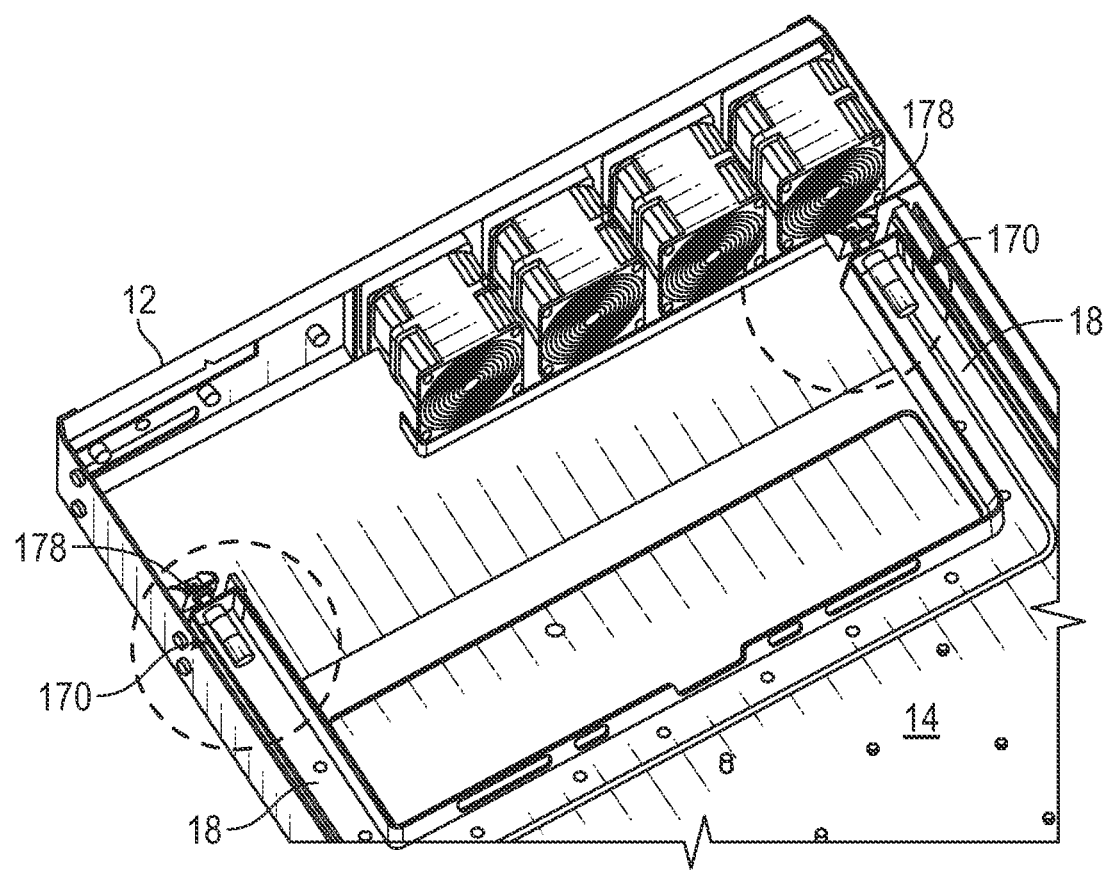
FIG. 6A is an isometric top cross-sectional view of an aspect of embodiment of a chassis interlock latch and a use case.
Figure 6B:
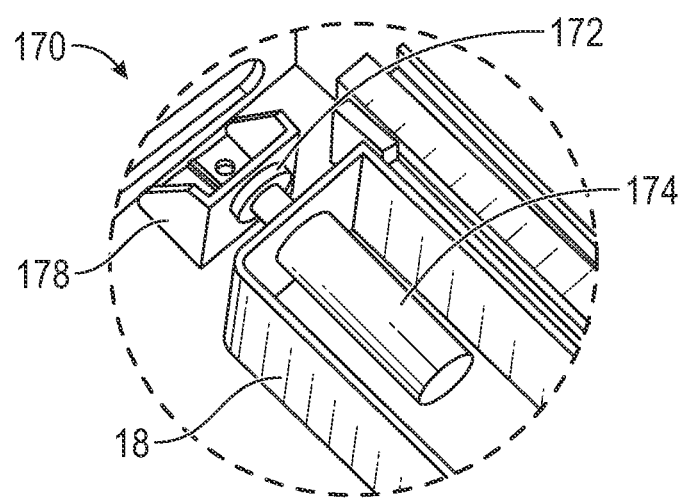
FIG. 6B illustrates a detail of an aspect of FIG. 6A.

FIG. 6A is an isometric top cross-sectional view of an aspect of embodiment of a chassis interlock latch and a use case and FIG. 6B illustrates a detail of an aspect of FIG. 6A. FIG. 6A illustrates that 1U chassis 14 may have legs 18 extending toward the rear of 2U chassis 12. Legs 18 may be provided with a plunger assembly 170 acting against a stop 178. FIG. 6B illustrates that plunger assembly 170 may include a spring housing 174. A plunger 172 atop a rod 182 (FIG. 7B) is biased by a spring (not shown) to extend from spring housing 174. With spring housings 174 fixed to legs 118, the forces of plungers 172 against stops 178 acts to urge 1U chassis 14 to move a small distance forward 202 with respect to 2U chassis 12.

Figure 7A:
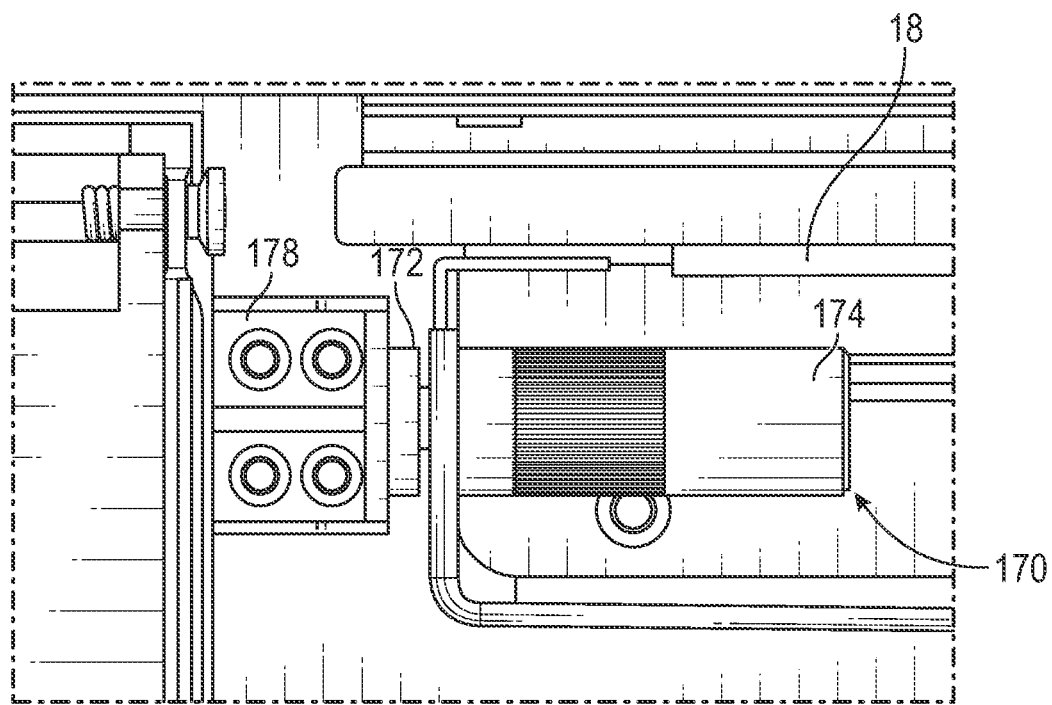
FIG. 7A illustrates a detail of an aspect of FIG. 6A.
Figure 7B:
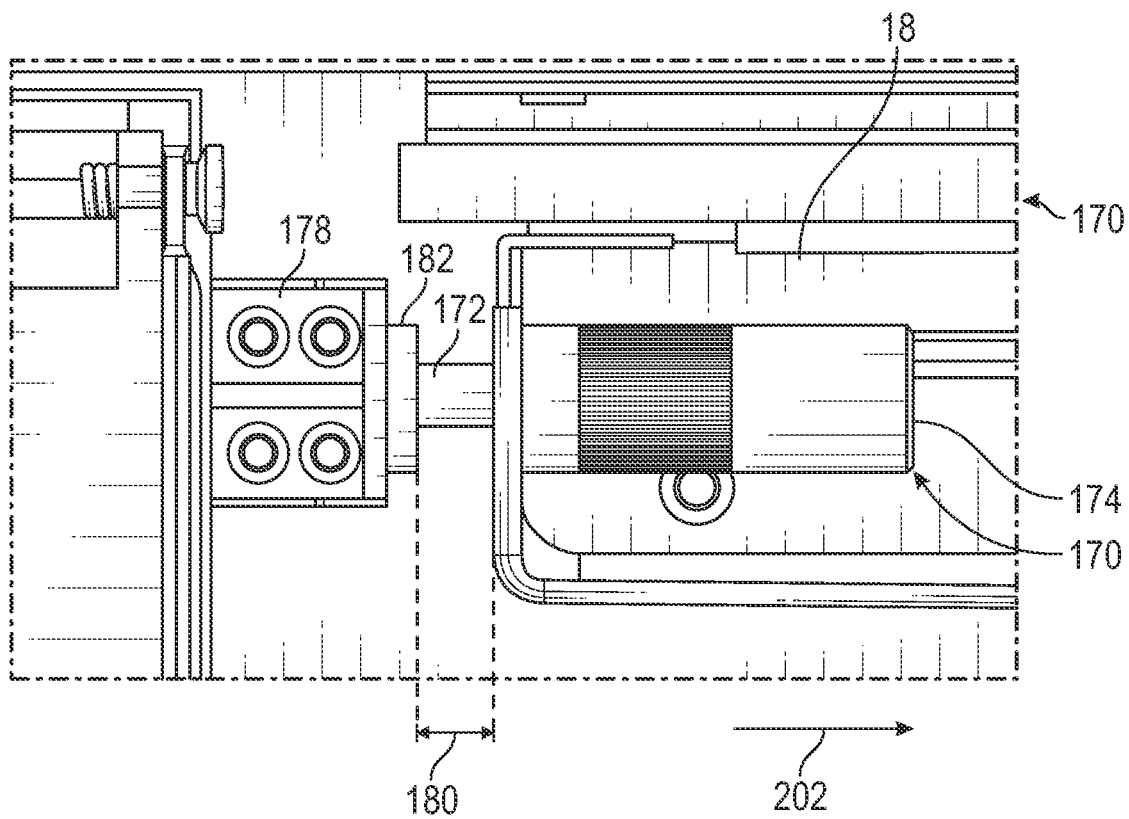
FIG. 7B illustrates a detail of an aspect of FIG. 6A.

FIG. 7A and FIG. 7B illustrate details of an aspect of FIG. 6A. In FIG. 7A, plunger assembly 170 is shown in a compressed state associated with 1U chassis 14 being completely installed within 2U chassis 12. In this compressed state, plunger 172 is compressed by stop 178 into spring housing 174. In FIG. 7B, plunger 170 is shown in an extended state in which leg 18 of 1U chassis 14 has moved forward 202 a distance of travel 180. In the embodiment, springs within spring housings 174 are sized so that when levers 114 of latches 100a, 100b are depressed, plungers 172 force 1U chassis 14 forward. A total forward travel 180 is available.

Figure 8A:
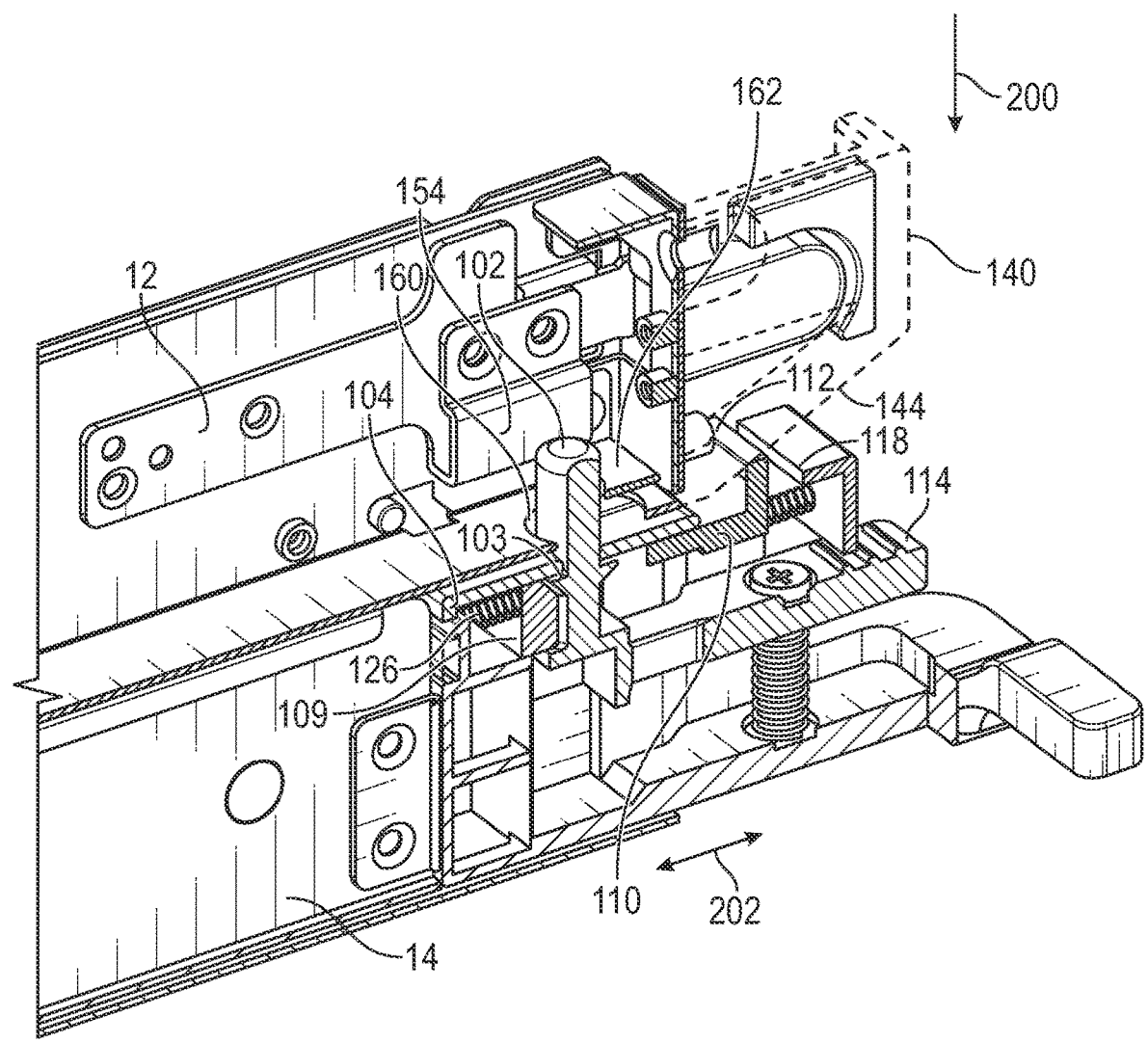
FIG. 8A is an isometric rear left cross-sectional view of an embodiment of a chassis interlock latch in a first state and a use case.
Figure 8B:
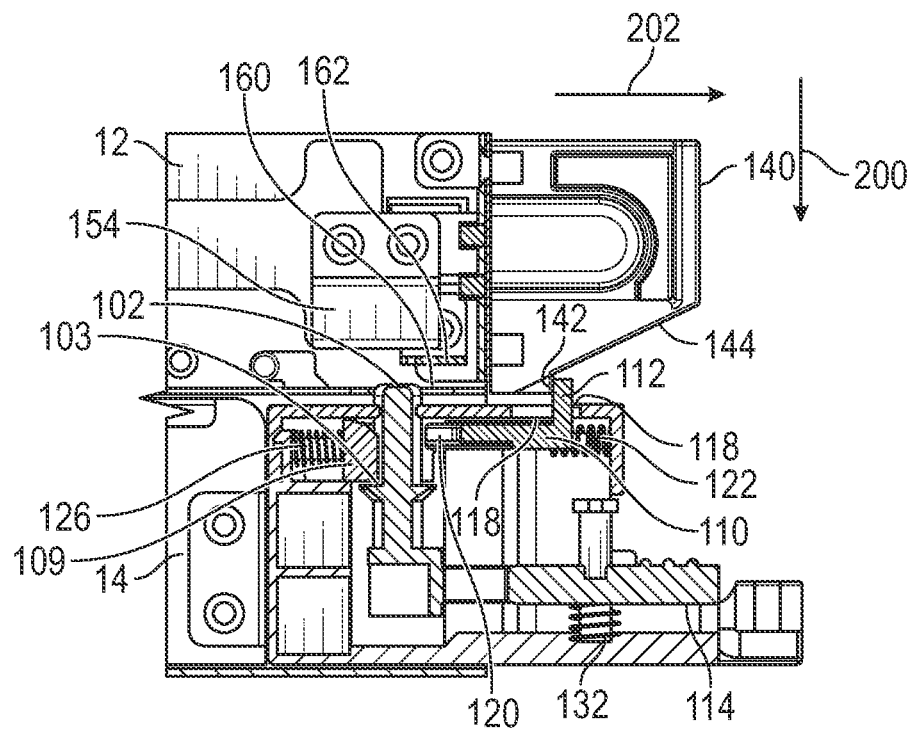
FIG. 8B is a left cross-sectional view of the embodiment of the chassis interlock latch of FIG. 8A.
Figure 8C:
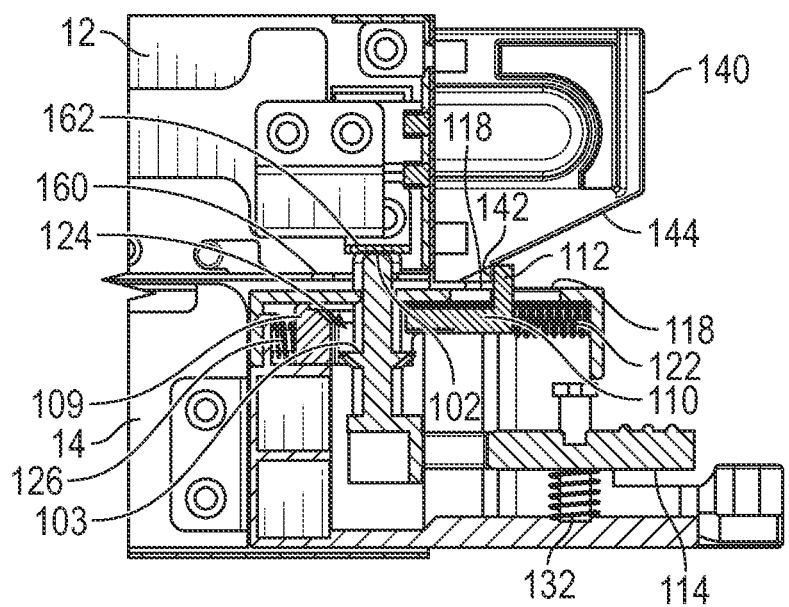
FIG. 8C is a left cross-sectional view of the embodiment of the chassis interlock latch of FIG. 8A.
Figure 8D:
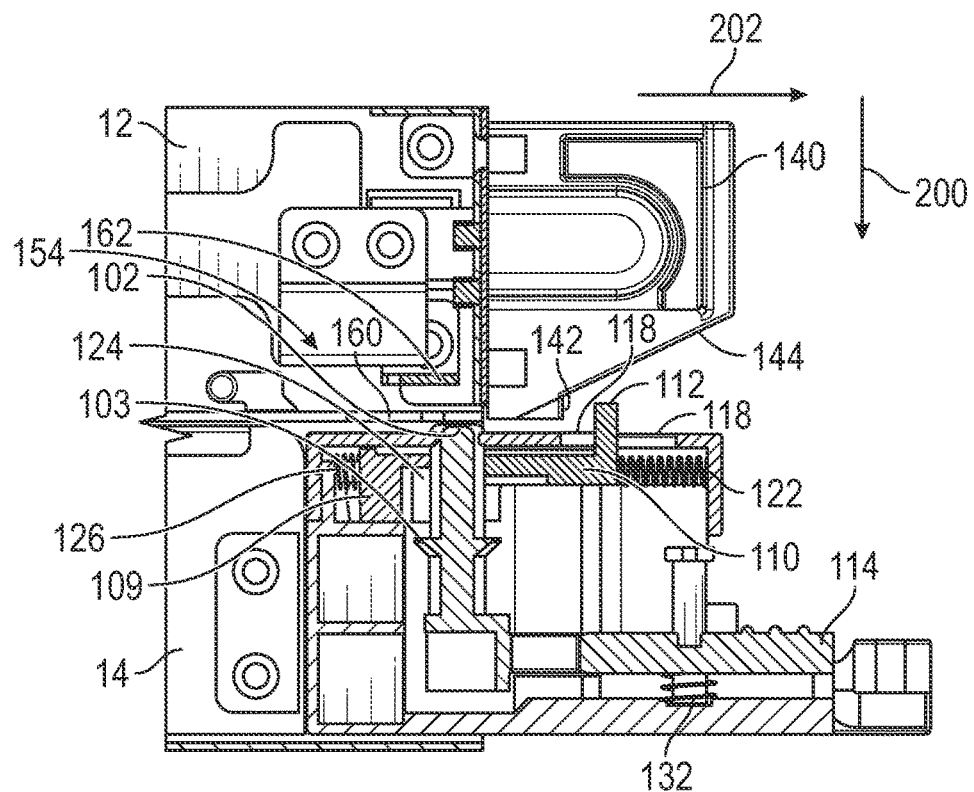
FIG. 8D is a left cross-sectional view of the embodiment of the chassis interlock latch of FIG. 8A.
Figure 8E:
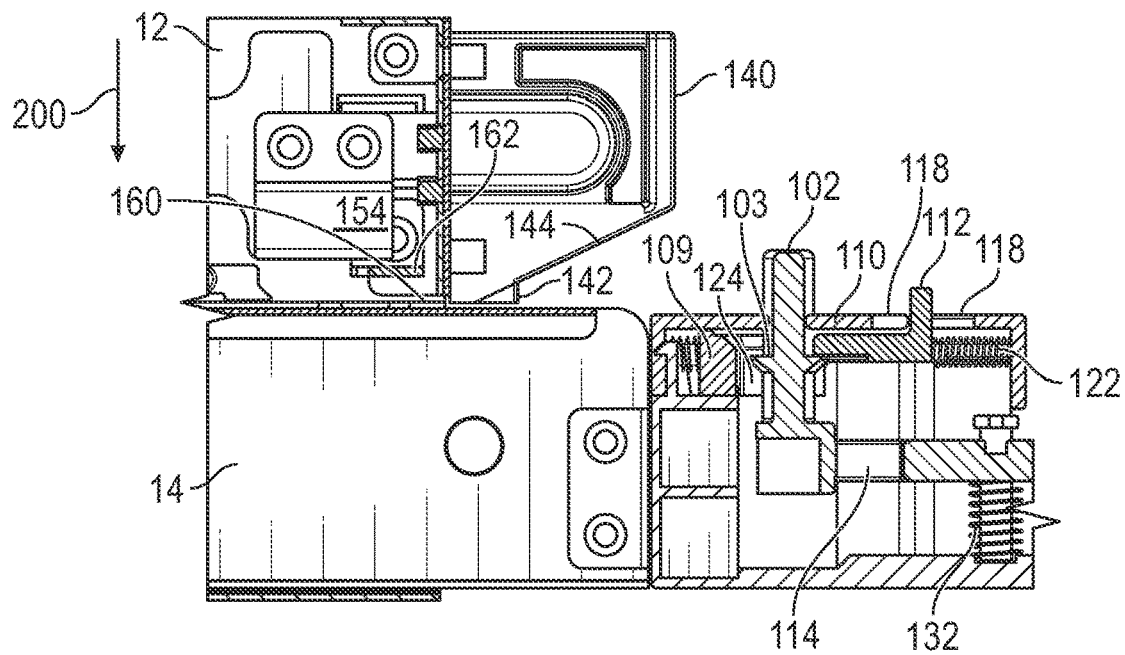
FIG. 8E is a left cross-sectional view of the embodiment of the chassis interlock latch of FIG. 8A.

FIG. 8A through FIG. 8E illustrate removing 1U chassis 14 from 2U chassis 12 and moving latch 100 from a first, fully latched state (FIG. 8A) to a second fully unlatched state (FIG. 8E).

FIG. 8A is an isometric rear left cross-sectional view of an embodiment of a chassis interlock latch in a first fully-latched state and a use case, with handle 140 rendered transparently. FIG. 8A shows 1U chassis 14 fully inserted within 2U chassis 12. In this fully inserted position, trigger 112 is forced forward within window 118 and retained in that position by lip 142 (FIG. 8B). Thus, by being forced forward 202 by lip 142 against trigger 112, slider 110 does not prevent slider 109 from moving forward 202 between cover 104 and shoulder 103 when handle 114 is depressed. In other words, in this fully inserted position, when handle 114 is pressed down 200 by a user, as the top of pin 102 passes below striker 162, plunger assemblies 174 (FIG. 7A, FIG. 7B) push 1U chassis 14 forward 202 within slot 160 to the position shown in FIG. 8C. Also, when handle 114 is pressed down 200, when shoulder 103 passes below slider 109, spring 126 moves slider 109 forward 202 so that slot 124 (FIG. 3) is about pin 102 above shoulder 103, as shown in FIG. 8B.

FIG. 8B is a left cross-sectional view of the embodiment of the chassis interlock latch of FIG. 8A in a first intermediate state continuing from FIG. 8A. FIG. 8B illustrates 1U chassis 14 moved partially forward 202 by plunger assemblies 174 (FIG. 7A, FIG. 7B) a fraction of the available travel 180 (FIG. 7B). The location of pin 102 at a midway point within slot 160 indicates 1U chassis 14 may be moved further forward. FIG. 8B illustrates that during this movement, slider 109, by being located above shoulder 103, maintains pin 102 below striker 162 as pin 102 travels forward 202 within pin slot 160. Note that as 1U chassis 14 (with latch 100b) travels forward 202 from 2U chassis 12, lip 142 recedes backward with respect to window 118 allowing spring 122 to move trigger 112 back within window 118 until slot 120 is about pin 102. The rearward movement of slider 110 causes pin 102 to come within slot 120, which correspondingly causes slider 110 to abut and move slider 109 rearward. Thus, absent an external travel limiter such as striker 162, pushing trigger 112 back within window 118 causes the displacement of pin 102 from slot 124 (see FIG. 3) and triggers upward movement of pin 102, e.g., from the intermediate retracted position of FIG. 8B to the intermediate extended position of FIG. 8E. Also note that in FIG. 8B, the intermediate position is a retracted intermediate position that may be further retracted in direction 200 as shown in FIG. 8D.

In an embodiment, slider 109 may be eliminated and 1U chassis 14 may be moved forward 202 by plunger assemblies 174 (FIG. 7A, FIG. 7B) when pin 102 is lowered below striker 162.

FIG. 8C is a left cross-sectional view of the embodiment of the chassis interlock latch of FIG. 8A in a second intermediate state continuing from FIG. 8B. In FIG. 8C, 1U chassis 14 is further partially extracted from 2U chassis 12. Pin 102 is in a partially extended position beneath striker 162 and fully forward 202 in slot 160. With pin 102 in this position, pin 102 prevents 1U chassis 14 from being fully extracted from 2U chassis 12. However, pin 102 is low enough that it no longer hinders lateral motion of plate 154. Thus, with both latches 100a, 100b in the same configuration, both tabs 156 may be depressed to disengage teeth 152, allowing 2U chassis 112 to be withdrawn from rack 10. FIG. 8C illustrates that with continued movement of 1U chassis 14 forward from FIG. 8B, trigger 112 has been urged rearward within window 118 by spring 122. The corresponding movement of slot 120 about pin 102 has displaced slider 109 from being above shoulder 103. This allowed pin 102 and handle 114 to be forced up by spring 132 (handle 114 having been released by the user after the initial downward press of FIG. 8A).

From the position of FIG. 8C 1U chassis 14 may be returned to the latched state of FIG. 8A by pushing 1U chassis 14 back into 2U chassis 12. This causes pin 102 to move backward until it clears from being under striker 162. The same rearward movement causes lip 142 to move trigger 112 away from pin 102 so that pin 102 clears striker 162, slot 120 is also no longer about pin 102. At that point, pin 102 may be urged upward by spring 132 to return automatically to the fully locked position of FIG. 8A.

FIG. 8D is a left cross-sectional view of the embodiment of the chassis interlock latch of FIG. 8A in a third intermediate state continuing from FIG. 8C. FIG. 8D illustrates that when handle 114 is fully depressed in direction 200, pin 102 descends below slot 160 to a fully retracted position and 1U chassis 14 may be slid forward 202 from 2U chassis 12. In the embodiment, the forward motion of 1U chassis 14 with regard to 2U chassis 12 shown in FIG. 8D is caused by plunger assemblies 174 (FIG. 7A, FIG. 7B) extending the full distance 180 (FIG. 7B). FIG. 8D also illustrates that with the movement of 1U chassis 14 forward 202 from the position of FIG. 8C, trigger 112 has been urged fully rearward within window 118 by spring 122 such that pin 102 is within slot 120. As shown in FIG. 8D, 1U chassis 14 may be fully withdrawn from 2U chassis 12 without interference between pin 102 and 2U chassis 12.

FIG. 8E is a left cross-sectional view of the embodiment of the chassis interlock latch of FIG. 8A in a second fully unlatched state, continuing from FIG. 8D. In this second state, 1U chassis 14 has been withdrawn from 2U chassis 12 to an extent that allows handle 114 to be released upward, at which point pin 102 extends upward until it abuts trigger 112.

FIG. 8F through FIG. 8J illustrate inserting 1U chassis 14 into 2U chassis 12 and returning latch 100 to the first, fully latched state of FIG. 8A.

Figure 8F:
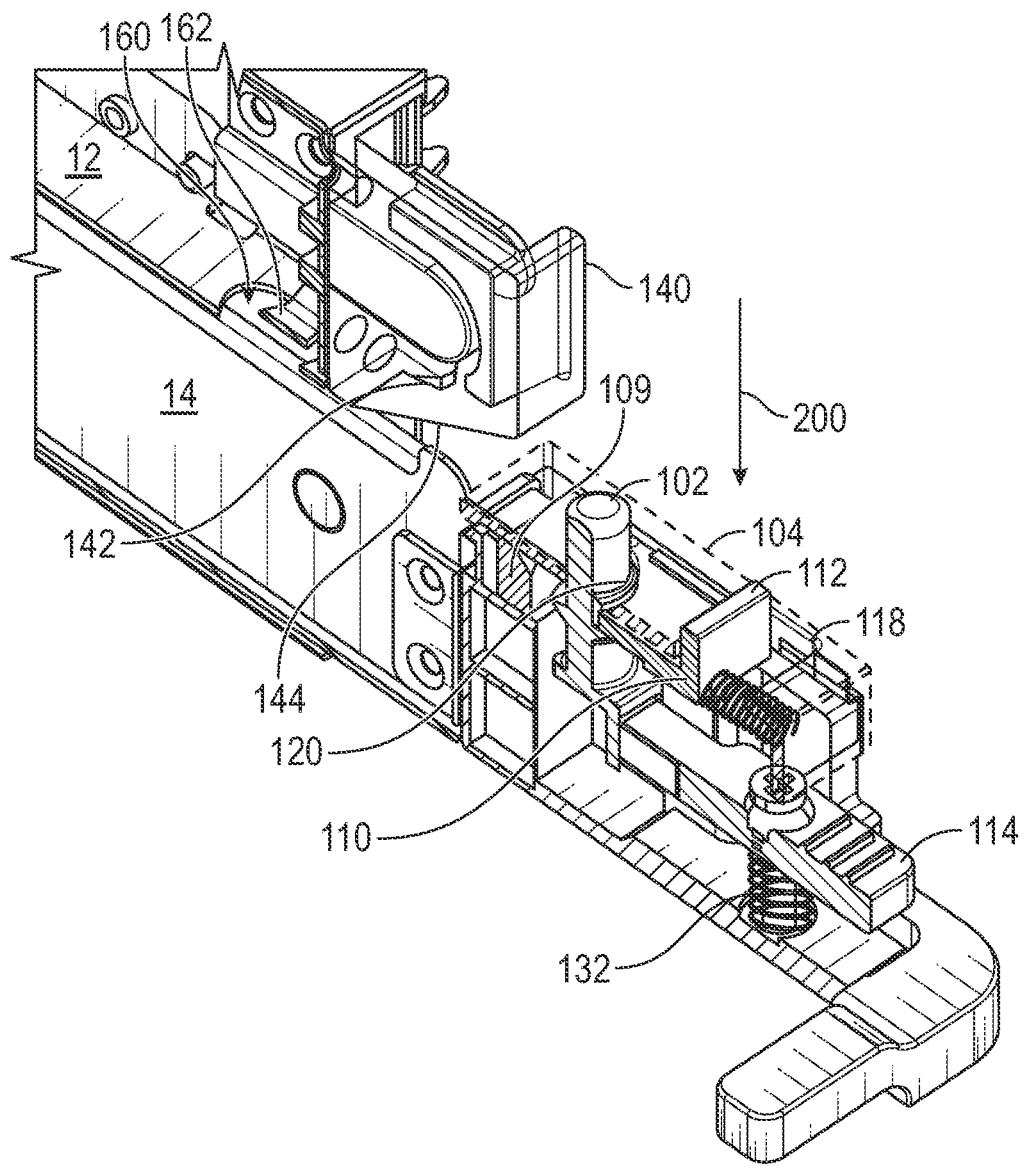
FIG. 8F is an upper left front isometric cross-sectional view of the embodiment of the chassis interlock latch of FIG. 8A.

FIG. 8F is an upper left front isometric cross-sectional view of the embodiment of the chassis interlock latch of FIG. 8A in the second state depicted in FIG. 8E. FIG. 8F further illustrates slot 120 of trigger 112 about pin 102. In FIG. 8F it should be noted that lip 142 is not continuous across chamfer 144. Thus, as described with regard to FIG. 8G and FIG. 8I, pin 102 may slide along chamfer 144 without encountering lip 142. In contrast, rearward motion of 1U chassis 14 causes trigger 112 to abut lip 142.

Figure 8G:
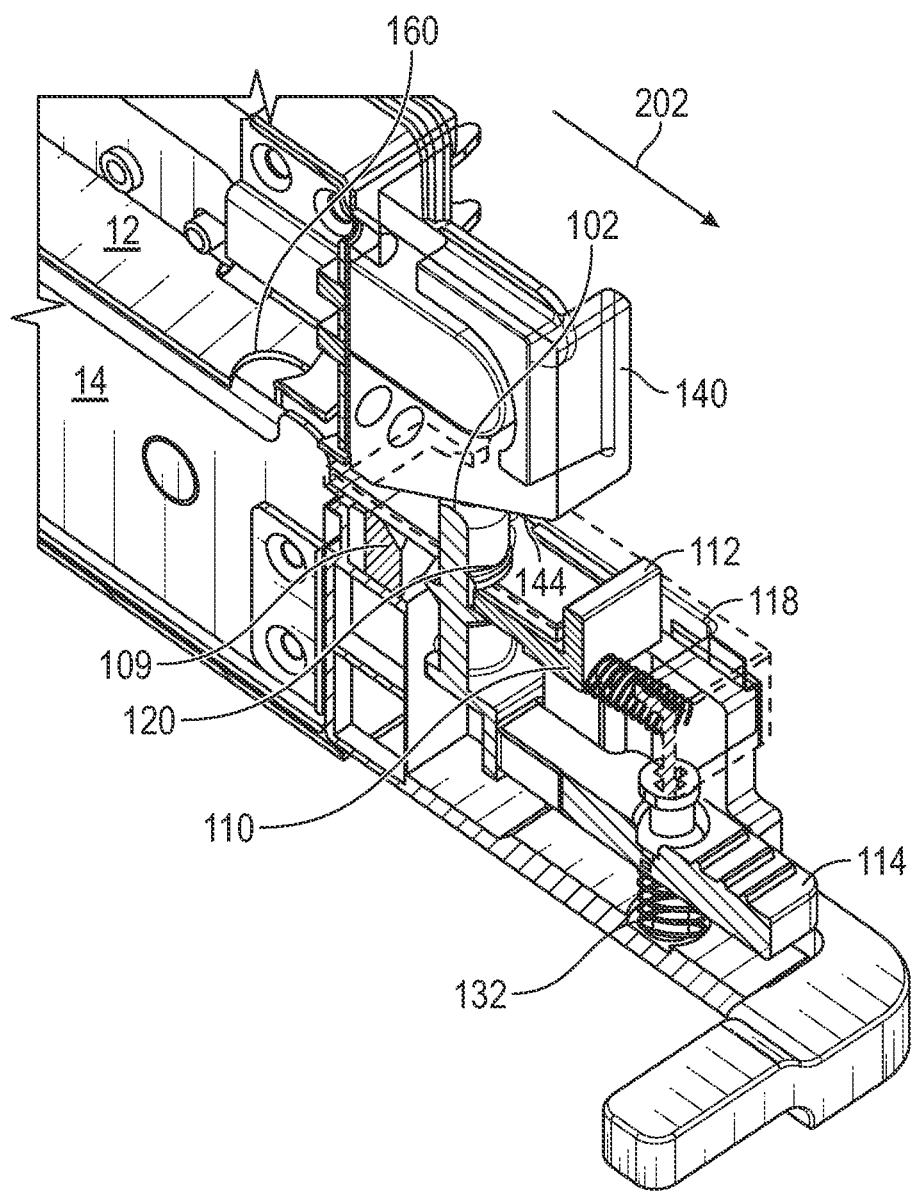
FIG. 8G is an upper left front isometric cross-sectional view of the embodiment of the chassis interlock latch of FIG. 8A.

FIG. 8G is an upper left front isometric cross-sectional view of the embodiment of the chassis interlock latch of FIG. 8A in a fourth intermediate state, continuing from FIG. 8F. In FIG. 8G, 1U chassis 14 has been pushed backward into 2U chassis 12 until pin 102 has come against chamfer 114 of handle 140. From this point, further rearward movement of 1U chassis 14 causes movement of pin 102 along chamfer 114 to force pin 102 downward. Note that this downward movement of pin 102 is accomplished automatically-without a user forcing handle 114 downward.

Figure 8H:
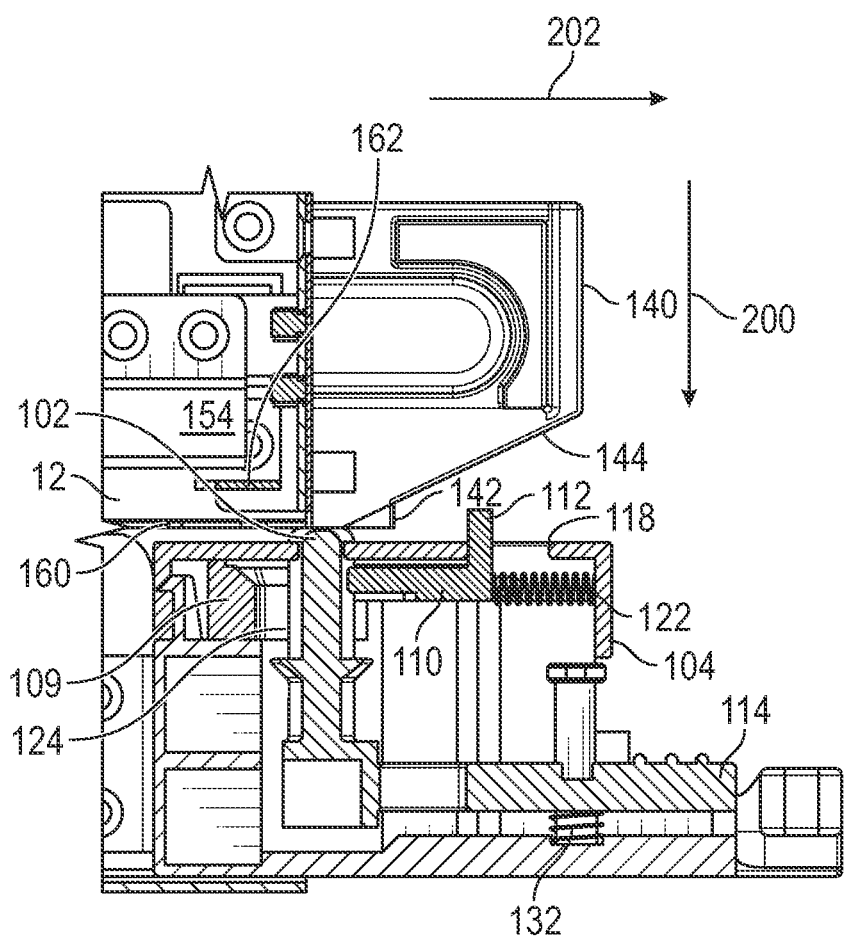
FIG. 8H is a left cross-sectional view of the embodiment of the chassis interlock latch of FIG. 8A.

FIG. 8H is a left cross-sectional view of the embodiment of the chassis interlock latch of FIG. 8A in the third intermediate state (of FIG. 8D, yet moving in the opposite direction), continuing from FIG. 8G. In FIG. 8H, 1U chassis 14 has been pushed backward into 2U chassis 12 until pin 102 has travelled down along chamfer 114 and lower than pin slot 160. At this point, pin 102 is still within slot 120, since trigger 112 is rearward within window 118.

Figure 8I:
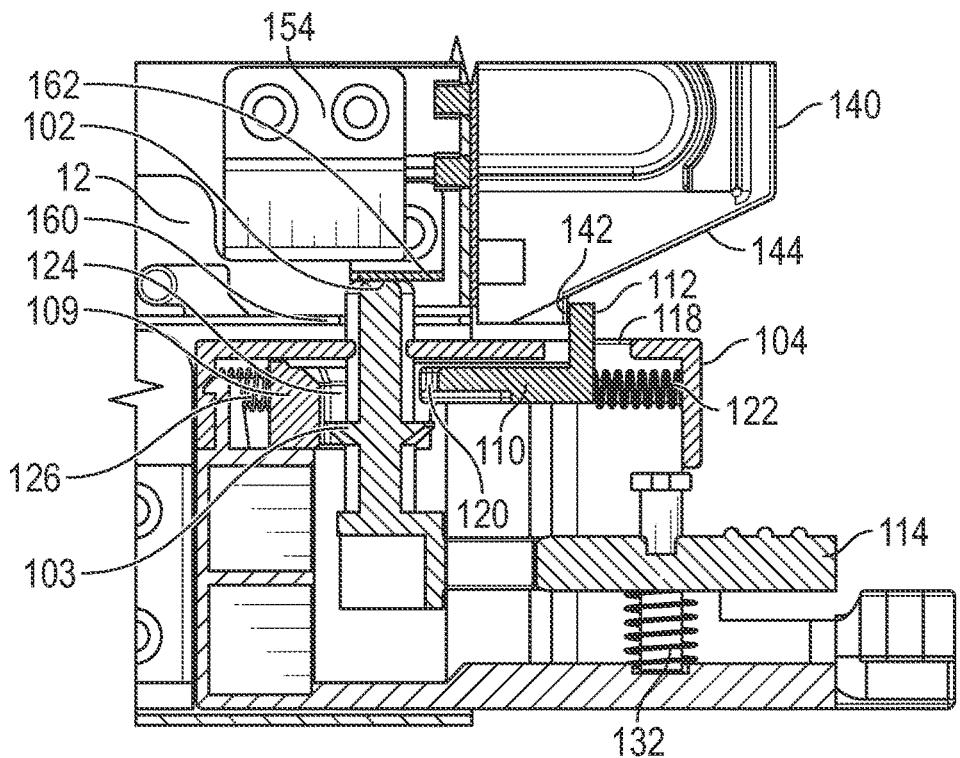
FIG. 8I is a left cross-sectional view of the embodiment of the chassis interlock latch of FIG. 8A.

FIG. 8I is a left cross-sectional view of the embodiment of the chassis interlock latch of FIG. 8A in an intermediate state slightly rearward from the second intermediate state (of FIG. 8D), continuing from FIG. 8H. In FIG. 8I, rearward movement of 1U chassis 14 has caused trigger 112 to abut lip 142 and trigger 112 is moved partially forward within window 118, the movement withdrawing slot 120 from pin 102. The rearward movement of chassis 14 has also brought pin 102 beneath slot 160, which allowed pin 102 to move upward against striker 162. It should be noted that slot 160, slot 120, and slot 124 are configured so that as pin 102 moves rearward and remains within slot 120, pin 102 clears the front edge of slot 160 and moves upward. Slider 109 is prevented by slider 110 from moving against pin 102 and hindering upward movement of shoulder 103. In other words, when inserting 1U chassis 14 back into 2U chassis 12, slider 109 is prevented from engaging shoulder 103 (the engagement is shown in FIG. 8B on withdrawing 1U chassis 14).

Figure 8J:
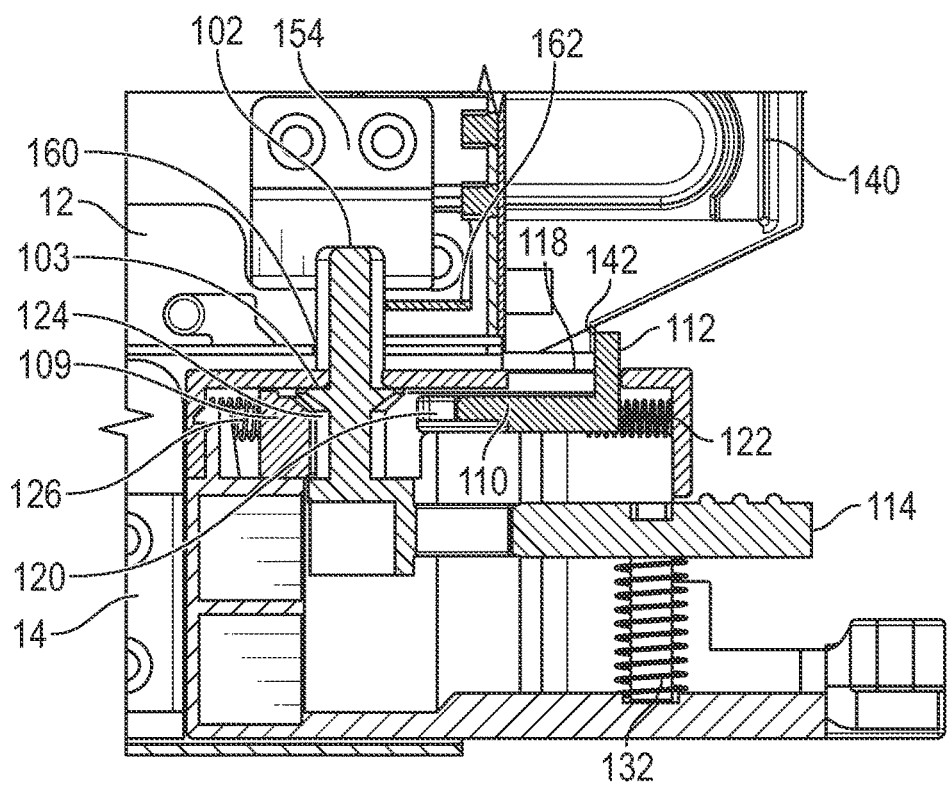
FIG. 8J is a left cross-sectional view of the embodiment of the chassis interlock latch of FIG. 8A.

FIG. 8J is a left cross-sectional view of the embodiment of the chassis interlock latch of FIG. 8A in the first fully latched state of FIG. 8A, continuing from FIG. 8I. In FIG. 8J, further rearward movement of 1U chassis 14 has moved pin 102 from beneath striker 162, allowing pin 102 to extend upward behind plate 154, which locks teeth 152 in the extended position and retains 2U chassis 12 within rack 10.

Embodiments, as described above, provide an interlock that requires two steps before the 2U chassis may be removed from the rack. First, levers 114 must be depressed to put pins 102 in the partially retracted position below strikers 162 as shown in FIG. 8C. Then tabs 156 are pressed inward to retract teeth 152 within 2U chassis side 16.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising a first latch including:
   a pin configured to move between an extended position and a retracted position, the pin including a shoulder;
   a first spring biasing the pin toward the extended position;
   a first slider movable between a first overlapping position and a first non-overlapping position with respect to the shoulder;
   a second spring biasing the first slider toward the first overlapping position;
   a second slider moveable between a triggering position and a non-triggering position with respect to the pin;
   a third spring biasing the second slider toward the triggering position, wherein:
   when the pin is in the retracted position and the second slider is in the non-triggering position, the second spring urges the first slider to the overlapping position in which the first slider prevents the pin from being moved to the extended position by the first spring; and
   when the pin is in the retracted position with the first slider overlapping the shoulder, movement of the second slider to the triggering position moves the first slider from the overlapping position, which allows the pin to be moved by the first spring to abut the second slider at a first intermediate position between the retracted position and the extended position.

2. The apparatus of claim 1, wherein:
   the first slider has a first thickness and includes a first slot configured to receive the pin;
   the second slider has a second thickness less than the first thickness and includes a second slot configured to receive the pin and a trigger extending through a window of the first latch; and
   the first slider and the second slider work in opposition about the pin such that movement of the first slider toward the pin causes ends of the first slot to abut ends of the second slot, which causes the second slider to move away from the pin.

3. The apparatus of claim 2, wherein:
   the third spring is configured to be stronger than the second spring such that, absent an external force on the first slider and second slider and with the pin in the retracted position, the third spring overcomes the second spring and maintains the pin within the second slot, with the pin displaced from the first slot.

4. The apparatus of claim 1, wherein the first latch is incorporated into a first chassis, the apparatus further including:
   a second chassis including:
      a second latch provided with a latch tooth movable between a locked position and an unlocked position;
      a fourth spring biasing the latch tooth toward the locked position; and
      a device slot for receiving the first chassis, wherein:
   when the first chassis is within the device slot, the latch tooth is in the locked position, and the pin is in the extended position, the pin hinders movement of the latch tooth toward the unlocked position.

5. The apparatus of claim 4, wherein latch tooth movement from the unlocked to the locked position is perpendicular to pin movement from the extended to the retracted position, and movements of the first slider and the second slider are perpendicular to both latch tooth movement from the unlocked to the locked position and pin movement from the extended to the retracted position.

6. The apparatus of claim 4, wherein:
   when the pin is in the retracted position, the first chassis may be inserted and removed from the device slot; and
   when the first chassis is received within the device slot and the pin is in the extended position, the pin extends into the first chassis, preventing the first chassis from being removed from the device slot.

7. The apparatus of claim 6, wherein the second chassis includes:
   an elongate slot configured to admit the pin into the first chassis; and
   a striker provided over a section of the elongate slot such that, when the first chassis is in a fully-received position within the device slot, the pin may extend through the elongate slot to the extended position, and, when the first chassis is in a partially-received position within the device slot, the pin may extend through the elongate slot to a second intermediate position abutting the striker.

8. The apparatus of claim 7, wherein:
   within the pin in the retracted position, the first chassis is moveable with respect to the device slot between the fully-received position, the partially-received position, and an extracted position;
   when the second chassis is in the fully-received position, the pin is movable from the retracted position through the pin slot to the extended position;
   when the second chassis is in the partially-received position, the pin is moveable between the retracted position through the pin slot to the second intermediate position; and
   when the first chassis is in the partially-received position and the pin is at the second intermediate position:
      movement of the first chassis to the extracted position is hindered by the pin slot limiting pin travel, and
      the latch tooth is moveable to the unlocked position without being hindered by the pin.

9. The apparatus of claim 8, wherein:
   when the first chassis is in the fully-received position or the partially-received position, the first chassis is biased toward the extracted position by a fifth spring;
   when the first chassis is in the fully-received position and the pin is moved from the extended position toward the retracted position, as the pin passes the striker, the first chassis is moved to the partially-received position by the fifth spring, and further movement of the first chassis to the extended position is prevented by the pin abutting an edge of the elongated slot.

10. The apparatus of claim 9, wherein:
    the first slider has a first thickness and includes a first slot configured to receive the pin;
    the second slider has a second thickness less than the first thickness and includes a second slot configured to receive the pin and a trigger extending through a window of the first latch; and
    the first slider and the second slider work in opposition about the pin such that movement of the first slider toward the pin causes ends of the first slot to abut ends of the second slot, which causes the second slider to move away from the pin.

11. The apparatus of claim 10, the second chassis provided with a lip configured to abut the trigger, the lip moving the trigger back within the window as the first chassis is moved from the partially-inserted position to the fully-inserted position within the device slot, the movement of the trigger causing a corresponding movement of the second slot away from the pin such that, with the first chassis in the fully-inserted position, the trigger is moved back within the window and the pin is fully withdrawn from the second slot.

12. The apparatus of claim 11, wherein the second chassis is provided with a handle including a chamfer configured such that, when the first chassis is in the extracted position and the pin is in the extended position, as the first chassis is inserted into the device slot, the pin abuts the chamfer and with further insertion the pin is compressed by the chamfer toward the retracted position until the pin passes an end of the chamfer.

13. The apparatus of claim 12, wherein the lip is provided on the handle and configured such that, when the first chassis is in the extracted position and the pin is in the extended position, as the first chassis is inserted into the device slot, the pin moves along the chamfer and past the lip without abutting the lip.

14. The apparatus of claim 1 further including a lever connected to the pin by which the pin is movable to the retracted position.

15. The apparatus of claim 4 wherein the fourth spring is a leaf spring, the first, second, and third springs are coil springs, and a tab connected to the fourth spring may be actuated to move the latch tooth from the locked position to the unlocked position.

* * * * *